(12) United States Patent
Sarin et al.

(10) Patent No.: US 11,961,570 B2
(45) Date of Patent: Apr. 16, 2024

(54) METHODS AND SYSTEMS OF CELL-ARRAY PROGRAMMING FOR NEURAL COMPUTE USING FLASH ARRAYS

(71) Applicants: Vishal Sarin, Saratoga, CA (US);
Vikram Kowshik, Cupertino, CA (US);
Purval Sule, Santa Clara, CA (US);
Siraj Fulum Mossa, Milipitas, CA (US)

(72) Inventors: Vishal Sarin, Saratoga, CA (US);
Vikram Kowshik, Cupertino, CA (US);
Purval Sule, Santa Clara, CA (US);
Siraj Fulum Mossa, Milipitas, CA (US)

( * ) Notice: Subject to any disclaimer, the term of this patent is extended or adjusted under 35 U.S.C. 154(b) by 0 days.

(21) Appl. No.: 16/912,694

(22) Filed: Jun. 25, 2020

(65) Prior Publication Data

US 2021/0043264 A1 Feb. 11, 2021

Related U.S. Application Data

(63) Continuation-in-part of application No. 16/452,217, filed on Jun. 25, 2019, now Pat. No. 11,461,621.
(Continued)

(51) Int. Cl.
*G11C 16/34* (2006.01)
*G06N 3/063* (2023.01)
(Continued)

(52) U.S. Cl.
CPC ......... *G11C 16/3459* (2013.01); *G06N 3/063* (2013.01); *G11C 11/54* (2013.01); *G11C 16/08* (2013.01); *G11C 16/10* (2013.01); *G11C 16/16* (2013.01); *G11C 16/24* (2013.01); *G11C 16/0466* (2013.01)

(58) Field of Classification Search
CPC ..... G11C 16/3459; G11C 11/54; G11C 16/16; G11C 16/08; G11C 16/24; G11C 16/10; G11C 16/0466; G11C 16/0416; G11C 16/0433; G06N 3/063; G06N 3/0635; G06F 7/5443
See application file for complete search history.

(56) References Cited

U.S. PATENT DOCUMENTS 5,172,338 A * 12/1992 Mehrotra .................. G11C 7/04
365/184
5,675,537 A * 10/1997 Bill ...................... G11C 11/5621
365/185.03
(Continued)

*Primary Examiner* — Ajay Ojha

(57) ABSTRACT

In one aspect, a method for NOR flash cell-array programming in a neural circuit includes the step of erasing a cell array. The method includes the step of programming a set of reference cells of a reference cell array to a target reference threshold voltage ($V_{t\_ref}$). The method includes the step of generating, with the reference cells, a current or voltage, reference signal. The method includes the step of using the reference signal to bias the neural cells during verification of program state of the neural cells to achieve their respective target threshold voltages ($V_{t\_cell}$). The method includes the step of programming a set of neural cells of a neural cell array to their respective target threshold voltages.

1 Claim, 10 Drawing Sheets

Related U.S. Application Data

(60) Provisional application No. 63/033,842, filed on Jun. 3, 2020, provisional application No. 62/872,864, filed on Jul. 11, 2019, provisional application No. 62/803,562, filed on Feb. 10, 2019, provisional application No. 62/773,773, filed on Nov. 30, 2018, provisional application No. 62/721,116, filed on Aug. 22, 2018, provisional application No. 62/689,839, filed on Jun. 26, 2018.

(51) Int. Cl.
*G11C 11/54* (2006.01)
*G11C 16/04* (2006.01)
*G11C 16/08* (2006.01)
*G11C 16/10* (2006.01)
*G11C 16/16* (2006.01)
*G11C 16/24* (2006.01)

(56) References Cited

U.S. PATENT DOCUMENTS

| | | | | |
|---|---|---|---|---|
| 5,754,475 A * | 5/1998 | Bill | ............... | G11C 11/5621 |
| | | | | 365/185.2 |
| 7,336,532 B2 * | 2/2008 | Chen | ............... | G11C 16/26 |
| | | | | 365/185.03 |
| 7,450,417 B2 * | 11/2008 | Kaneko | ............... | G11C 11/5628 |
| | | | | 365/185.03 |
| 7,715,235 B2 * | 5/2010 | Cernea | ............... | G11C 16/0483 |
| | | | | 365/185.19 |
| 9,620,233 B1 * | 4/2017 | Dong | ............... | G11C 7/04 |

\* cited by examiner

METHODS AND SYSTEMS OF CELL-ARRAY PROGRAMMING FOR NEURAL COMPUTE USING FLASH ARRAYS

CROSS-REFERENCE TO RELATED APPLICATIONS

This application claims priority to and is a continuation-in-part of U.S. patent application Ser. No. 16/452,217, titled METHODS AND SYSTEMS OF IMPLEMENTING POSITIVE AND NEGATIVE NEURONS IN A NEURAL ARRAY-BASED FLASH MEMORY and filed on 25 Jun. 2019. This application is hereby incorporated by reference in its entirety.

U.S. patent application Ser. No. 16/452,217 claims priority to U.S. provisional patent application No. 62/689,839, titled FORMING NEURONS WITH USING SLC FLASH CELLS and filed on 26 Jun. 2018. This application is hereby incorporated by reference in its entirety. U.S. patent application Ser. No. 16/452,217 claims priority to U.S. provisional patent application No. 62/721,116, titled METHODS AND SYSTEMS OF NEURAL-ARRAY BASED FLASH MEMORY and filed on 22 Aug. 2018. This application is hereby incorporated by reference in its entirety. U.S. patent application Ser. No. 16/452,217 claims priority to U.S. provisional patent application No. 62/803,562, titled DIFFERENT FLASH CELLS FOR NEURONS and filed on Feb. 10, 2019. This application is hereby incorporated by reference in its entirety. U.S. patent application Ser. No. 16/452,217 claims priority to U.S. provisional patent application No. 62/773,773, titled FORMING NEURONS WITH USING SLC FLASH CELLS and filed on 30 Nov. 2018. This application is hereby incorporated by reference in its entirety.

This application claims priority to and is a continuation-in-part of U.S. patent application No. 63/033,842, titled METHODS AND SYSTEMS OF REFERENCE CELL CONFIGURATIONS FOR DIFFERENT and filed on 3 Jun. 2020. This application is hereby incorporated by reference in its entirety.

This application claims priority to and is a continuation-in-part of U.S. patent application No. 62/872,864, titled METHODS AND SYSTEMS OF AN ERASE ALGORITHM OF A NEURAL CIRCUIT and filed on Jul. 11, 2019. This application is hereby incorporated by reference in its entirety.

BACKGROUND

1. Field

This application relates generally to electronic circuits, and more particularly to a system, method and article of manufacture of cell-array programming in a neural-array based flash memory.

2. Related Art

Solutions available today use CPU's and GPU's to implement and accelerate neural network models in hardware. Improvements are desired in neural network hardware accelerators to improve performance and reduce power consumption. The implementation techniques for neural networks presented in the current invention enables such compute operations at very high-performance levels while consuming very low energy. This opens up various possible applications which can benefit from neural networks.

BRIEF SUMMARY OF THE INVENTION

In one aspect, a method for NOR flash cell-array programming in a neural circuit includes the step of erasing a cell array. The method includes the step of programming a set of reference cells of a reference cell array to a target reference threshold voltage ($V_{t\_ref}$). The method includes the step of generating, with the reference cells, a current or voltage, reference signal. The method includes the step of using the reference signal to bias the neural cells during verification of program state of the neural cells to achieve their respective target threshold voltages ($V_{t\_cell}$). The method includes the steps of programming a set of neural cells of a neural cell array to their respective target threshold voltages.

Figure 1:
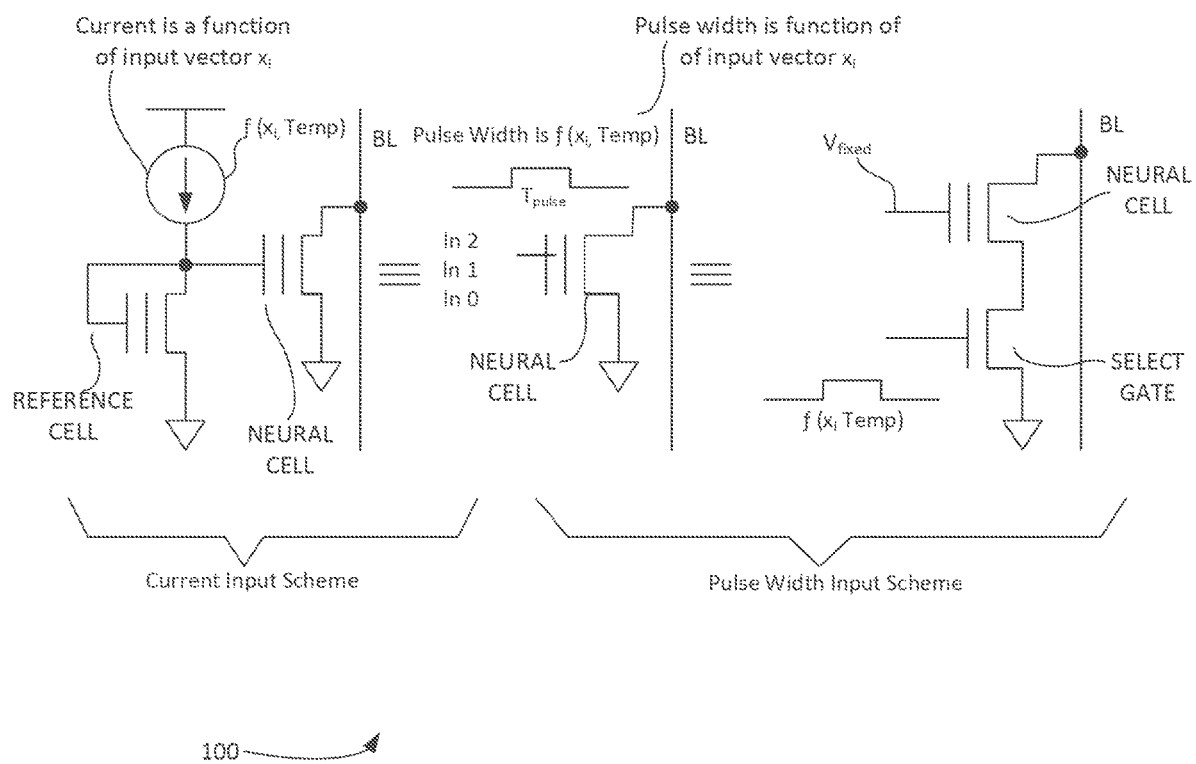
FIG. 1 illustrate a set of basic cell configurations and methods to implement neural compute using flash cells.

The Figures described above are a representative set and are not an exhaustive with respect to embodying the invention.

DESCRIPTION

Disclosed are a system, method, and article of manufacture of cell-array programming in a neural-array based flash memory. The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' 'an embodiment,' 'one example,' or similar language means that a particular feature, structure, or characteristic described in connection with the embodiment is included in at least one embodiment of the present invention. Thus, appearances of the phrases 'in one embodiment,' 'in an embodiment,' and similar language throughout this specification may, but do not necessarily, all refer to the same embodiment.

Furthermore, the described features, structures, or characteristics of the invention may be combined in any suitable manner in one or more embodiments. In the following description, specific details are provided, such as examples of programming and erase algorithms and methods etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flowchart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Example definitions for some embodiments are now provided.

Nor flash can be a kind of flash cell arrays where the individual flash cells are connected to the bit lines in a NOR gate configuration with the NMOS drain or the PMOS source connected to the same bit lines of the cell array.

Analog-to-digital converter (ADC) is a system that converts an analog into a digital signal.

Bandgap voltage reference is a temperature independent voltage reference circuit used in integrated circuits. It can produce a fixed (e.g. constant) voltage or current regardless of power supply variations, temperature changes and circuit loading from a device.

Boltzmann constant (k) is a physical constant relating the average kinetic energy of particles in a gas with the temperature of the gas.

Digital-to-analog converter (DAC) is a system that converts a digital signal into an analog signal.

Drain-induced barrier lowering (DIBL) is a short-channel effect in MOSFETs referring to a reduction of threshold voltage of the transistor at higher drain voltages.

Flash memory is an electronic solid-state non-volatile storage medium that can be electrically erased and reprogrammed.

Least significant bit (LSB) is the bit with the lowest significance in a word.

Metal-oxide-semiconductor field-effect transistor (MOSFET) is a type of field-effect transistor (FET). It can include an insulated gate; whose voltage determines the conductivity of the device. This ability to change conductivity with the amount of applied voltage can be used for amplifying or switching electronic signals.

Most significant bit (MSB) is the bit with the highest significance in a word.

Neuron is a non-volatile memory cell system, with a preferred embodiment being a flash-cell system modelled on attributes of individual neurons and networks of neurons in a nervous system. In some examples, the equation for a neuron can be:

$$\text{Neuron Equation} = \sum_{i=1}^{z} Xi * Yi + \text{bias}$$

Here, $X_i$ is the set of input vectors, $Y_i$ is a parameter which is related to the threshold voltage of individual flash cells or resistance of non-volatile memory cells; and b is a bias variable.

Operational amplifier (Op Amp) is a DC-coupled high-gain electronic voltage amplifier with a differential input and, usually, a single-ended output.

NMOS is an n-channel MOSFET.

Parasitic trap is a region in a semiconductor material where electrons or holes are trapped.

Detrap is a process to remove the trapped electrons or holes in a region of semiconductor material.

Programming pulses are voltage or current pulses applied to the drain, source, gate or substrate region of flash cells to change the threshold voltage of the flash cells, in one embodiment from low threshold voltage to a higher threshold voltage; and are based on incremental-step-pulse programming (ISPP) methods in one embodiment Erase pulses are voltage or current pulses applied to the drain, source, gate or substrate region of flash cells to change the threshold voltage of the flash cells, in one embodiment from high threshold voltage to a lower threshold voltage.

Program verify is the verification process during programming of flash cells by reading the cell currents of the flash cells to determine if the desired program threshold voltage is reached.

Erase verify is the verification process during erasing of flash cells by reading the cell currents of the flash cells to determine if the desired erase threshold voltage is reached.

Weak erase uses an erase voltage that is weaker than the erase voltage of a full erase operation. The weak erase can be at a level such that it only detraps the shallow traps in the oxide or nitride layer of the flash cell without effectively changing the threshold voltage.

Example Computer Architecture and Systems

FIG. 1 illustrate a set of basic cell configurations and methods to implement neural compute using flash cells. Two different embodiments are shown by way of example. In one embodiment, the input Xi can be a current (and/or multiples of currents) translated to intermediate voltage and provided to a control-gate of flash cell. The current can be IDAC. In another embodiments, the input can be given as a pulse (and/or multiples of pulses) to the select-gate or the control gate of the flash cell. The pulse width is a function Xi. The weight levels.

Figure 2:
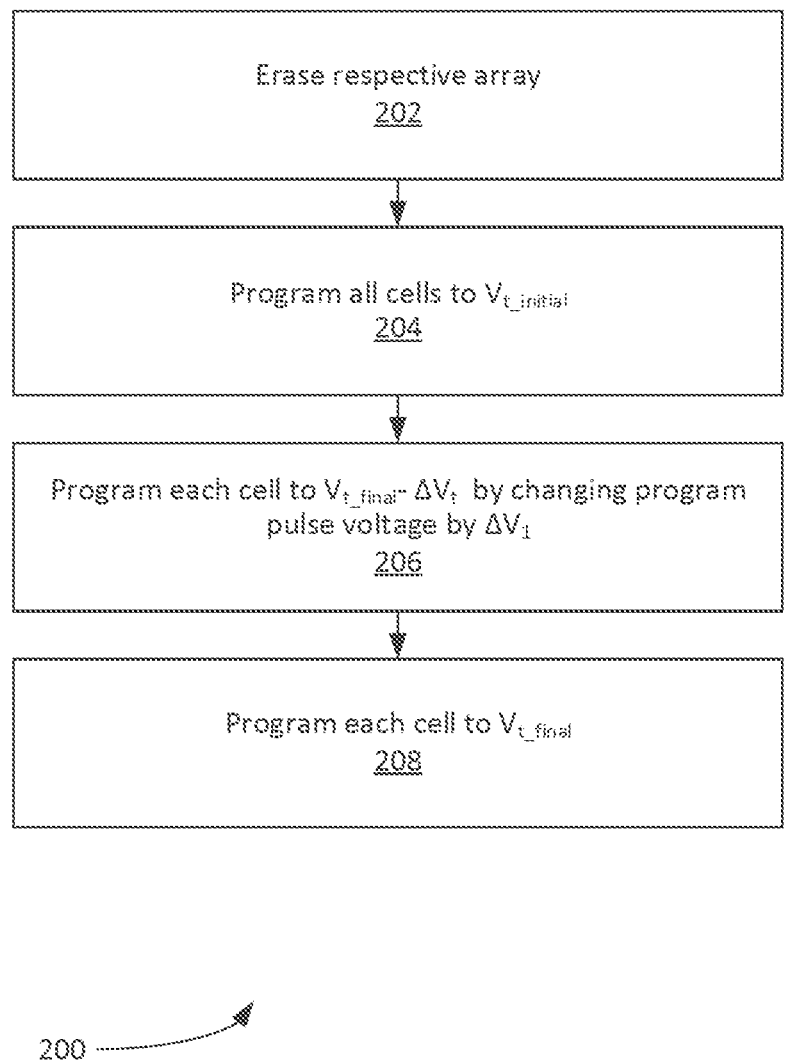
FIG. 2 illustrates an example cell-array programming process, according to some embodiments.

FIG. 2 illustrates an example process 200 of a cell-array programming sequence, according to some embodiments. Process 200 can illustrate a progressive sequence from a reference array to a neuron array. It is noted that $V_t$ is the target threshold. In step 202, process 200 can erase a respective reference array and/or a respective neural array. It is noted that some example embodiments may not include reference cells. Step 202 can use voltage and current references as points of comparison during program verify to achieve target $V_t$. In step 204, process 200 can program all reference cells to the $V_t$ initial. In step 206, process 200 can program each cell to $V_{final}-\Delta V_t$ by changing the program pulse voltage by $\Delta V_1$. In step 208, process 200 can program each neural cell to $V_{tfinal}$.

Figure 3:
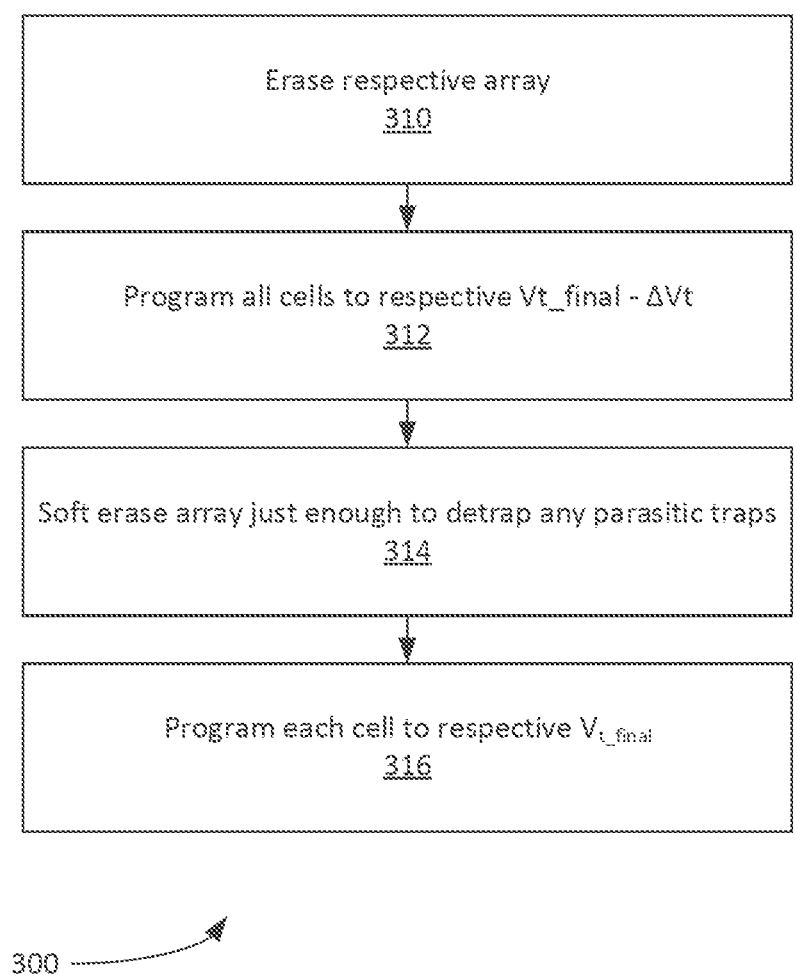
FIG. 3 illustrate a set of example methods of a cell-array programming process, according to some embodiments.

FIG. 3 illustrate a set of example methods of a cell-array programming process 300, according to some embodiments. Steps 310-316 illustrate an alternative method of process 300. In this step, in one embodiment, process 300 can use the last stored pulse height per cell and provide multiple pulses of the same height. It is noted that programming pulses can be provided to the source, gate or drain of a cell (e.g. depending on memory technology) thereby increasing or decreasing the cell threshold voltage with programming pulses, etc. $V_t$ is the target threshold. In step 310, process 300 can erase a respective array. In step 312, process 300 can program all cells to respective $V_{t\_final}-\Delta V_t$. In step 314, process 300 can soft erase (e.g. a weak erase, etc.) the cell array just enough to detrap any parasitic traps. In step 316, process 300 can program each cell to a respective $V_t$.

It is noted that processes 200 and/or 300 can be used to achieve target threshold values.

Figure 4A:
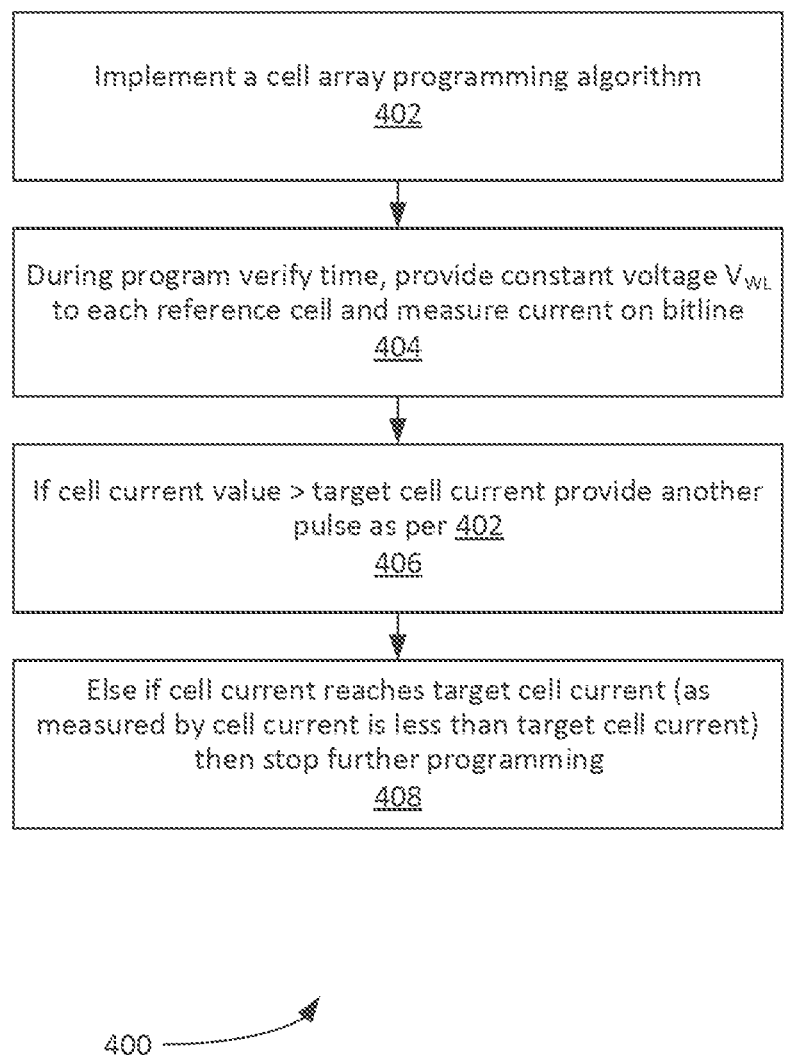
FIGS. 4 A-B illustrate an example process for implementing a cell array programming for reference cells or neural cells, according to some embodiments.
Figure 4B:
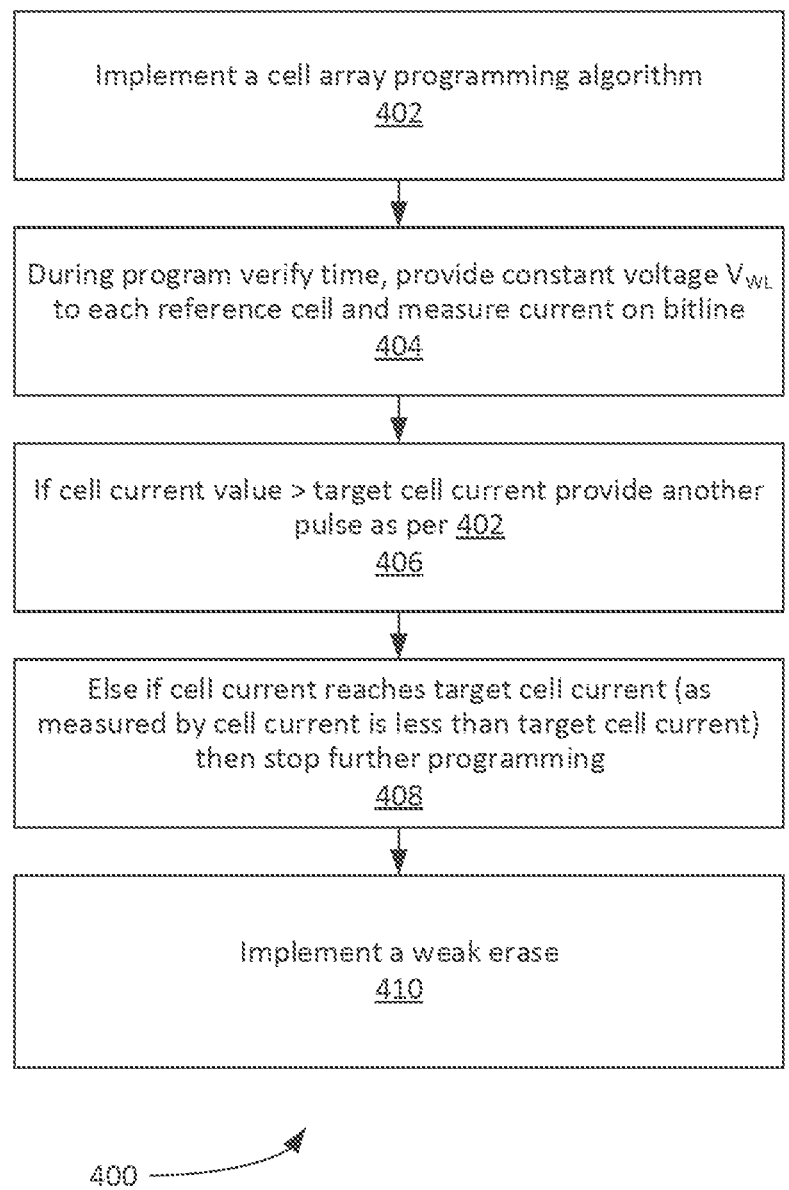

FIGS. 4 A-B illustrate an example process 400 for implementing a cell array programming for reference cells or neural cells, according to some embodiments. In step 402, process 400 can implement a cell array programming algorithm. In step 404, process 400 can, during program verify time, provide constant voltage $V_{wl}$ to each reference cell and/or neural cell and measure the current on bit line. In step 406, if cell current>target cell current, process 400 can provide another pulse as per the cell array programming algorithm of step 402. In step 408, else if cell current reaches target cell current (e.g. as measured by cell current is less than target cell current) then process 400 can stop further programming, in step 410 of FIG. 4B, process 400 implements a weak erase. The weak erase can be at a level such that it only detraps the shallow traps in the oxide or nitride layer of the flash cell without effectively changing the threshold voltage. Accordingly, the erase voltage can be set to barely detrap the shallow traps.

Figure 5:
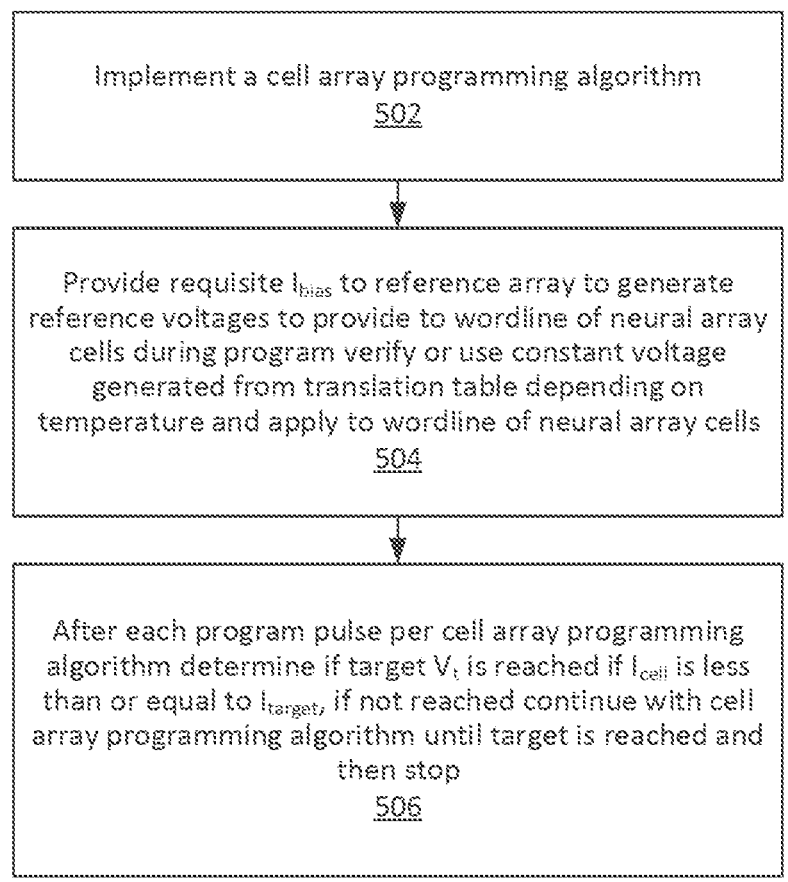
FIG. 5 illustrates an example for implementing a cell array programming for neural cells, according to some embodiments.

FIG. 5 illustrates an example 500 for implementing a cell array programming for neural cells, according to some embodiments. In step 502, process 500 can implement a cell array programming algorithm. In step 504, process 500 can provide requisite $I_{bias}$ to reference cells to generate reference voltages to provide a wordline of neural array cells during a program verify operation or, alternatively, use the voltages generated from a translation table depending on temperature. In step 506, process 500 can, after each program pulse per cell array programming algorithm, determine if target $V_t$ is reached if $I_{cell}$ is less than or equal to $I_{target}$. If it is not reached, process 500 can continue with the cell array programming algorithm until the target is reached and then stop.

It is noted that in some example embodiments, flash cells can be replaced by two transistor flash cells (e.g. where the $2^{nd}$ transistor is series connected to the flash cell and used as a select device); or split gate flash cells; and/or other non-volatile memory cells. It is further noted that NMOS flash cells can be replaced by PMOS flash cells in some example embodiments.

Figure 6:
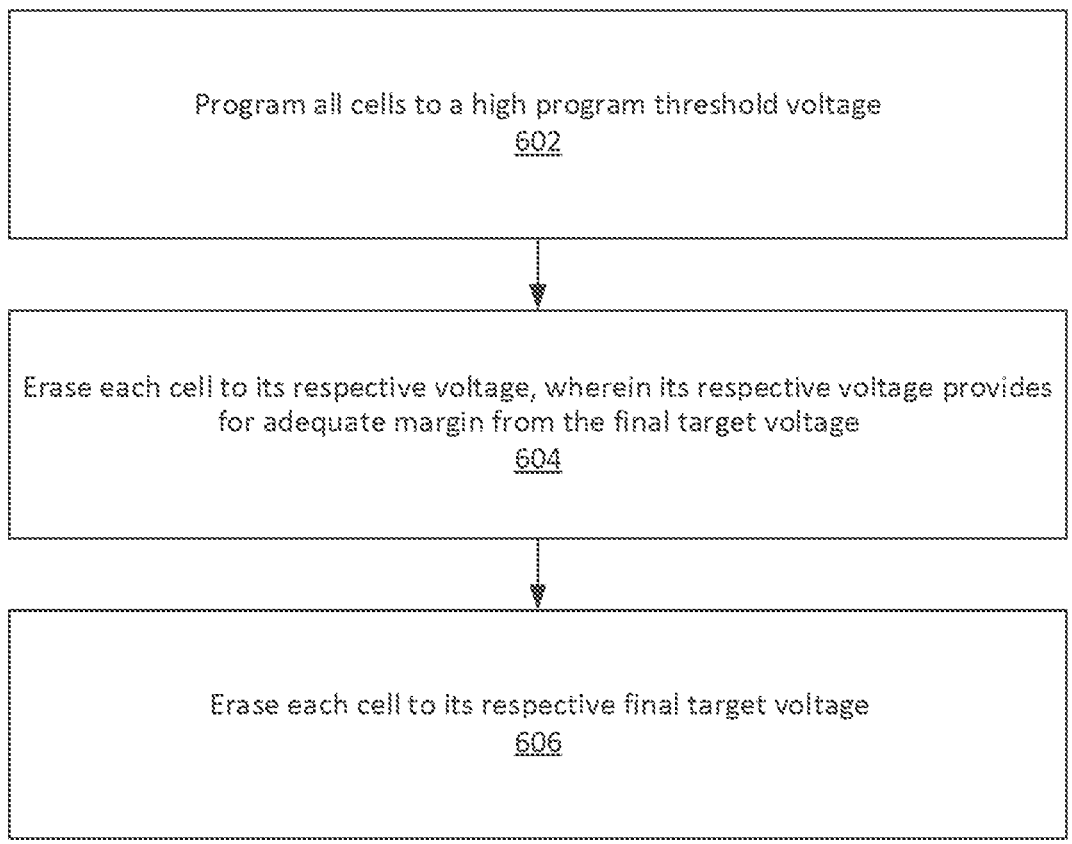
FIG. 6 illustrates an example process of program and staged erase algorithm in a neural-array based flash memory, according to some embodiments.

FIG. 6 illustrates an example process of program and staged erase algorithm in a neural-array based flash memory, according to some embodiments. In step 602, process 600 can program all cells in a specified neural circuit to a high program threshold voltage. In step 604, process 600 can erase each cell to its respective voltage. The respective voltage provides for adequate margin from a final target voltage, in step 606, process 600 can erase each cell to its respective final target voltage. The erase sequence of process 600 can be used to empty shallow traps in the oxide layers of the flash cells. In this way, the additive threshold voltage errors can be reduced. The accuracy of the neural network applications using NOR flash cells as neural synapse can also be improved.

Figure 7:
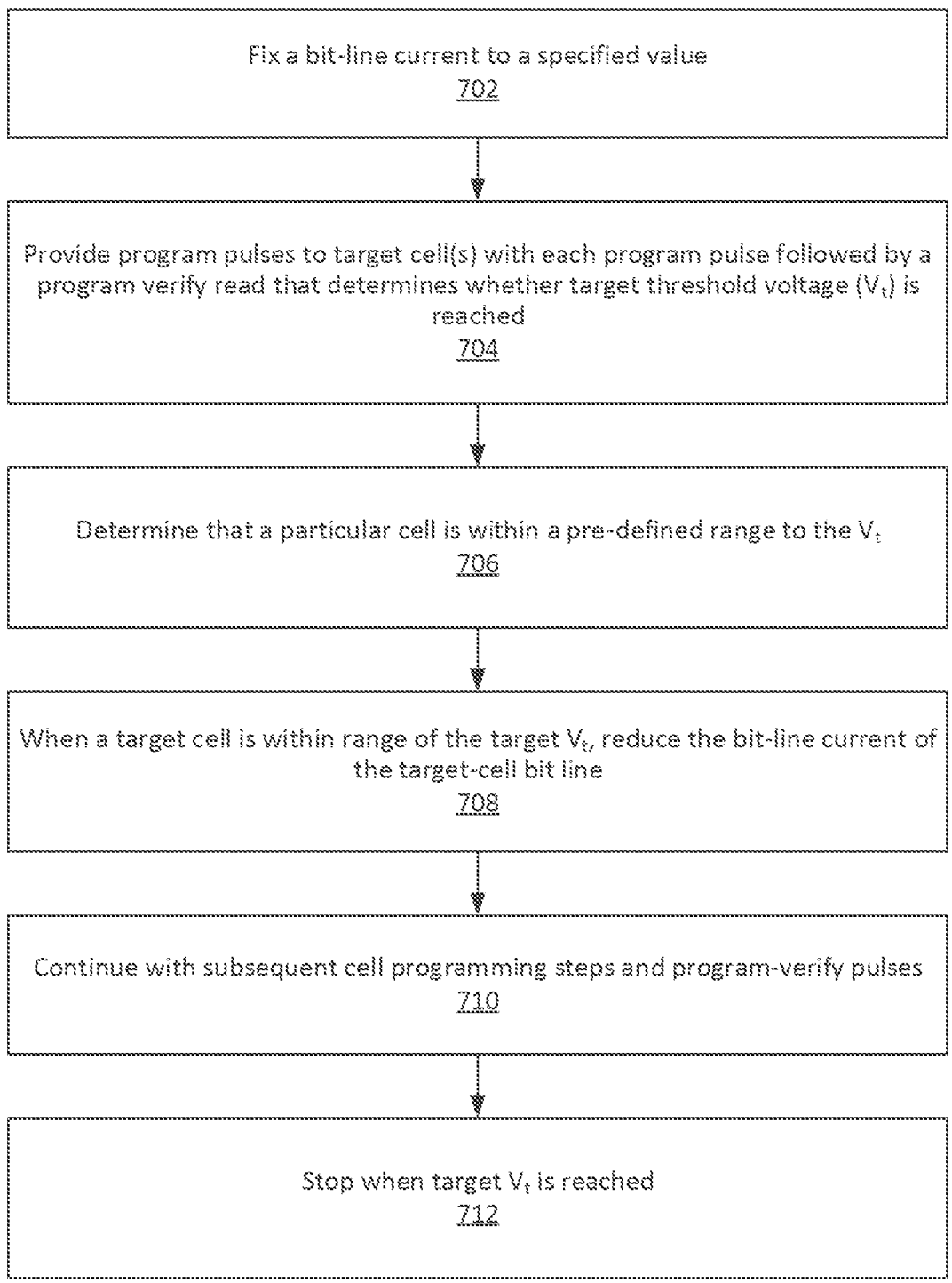
FIG. 7 illustrates an example process for implementing a soft-landing algorithm in a neural array-based flash memory, according to some embodiments.

FIG. 7 illustrates an example process 700 for implementing a soft-landing algorithm in a neural array-based flash memory, according to some embodiments. Process 700 can be used for flash cells of a neural-array based flash memory that use a bit-line current as a program control mechanism. Examples of a bit-line current as a program control mechanism can include, inter alia: channel-hot electrons, source-side injections, hot-carrier injections, etc. In step 702, process 700 can fix a bit-line current of the neural circuit to a specified value. In step 704, process 700 can provide program pulses to target cell(s) with each program pulse followed by a program verify read that determines whether target threshold voltage ($V_t$) is reached. In step 706, process 700 can determine that a particular cell is within a pre-defined range to the $V_t$. In step 708, process 700 can, when a target cell is within range of the target $V_t$, reduce the bit-line current of the target-cell bit line. In step 710, process 700 can continue with subsequent cell programming steps and program-verify pulses. In step 712, process 700 can stop when the target $V_t$ is reached.

Figure 8:
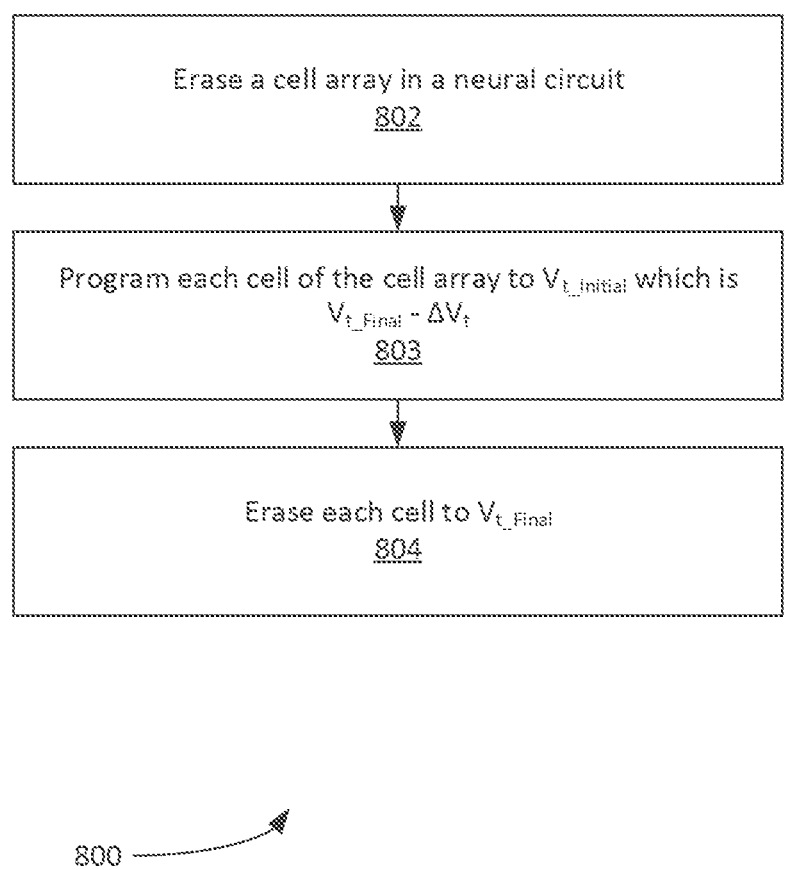
FIG. 8 illustrates an example process for cell-array programming in a neural circuit, according to some embodiments.

FIG. 8 illustrates an example process 800 for cell-array programming in a neural circuit, according to some embodiments. In step 802, process 800 erases a cell array in a neural circuit. In step 803, process 800 programs each cell of the cell array to an initial target threshold voltage ($V_t$) value, where the initial target threshold voltage is greater than the final target threshold voltage by a small $\Delta V_t$. In step 804, cell is erased to the final target threshold voltage.

Figure 9:
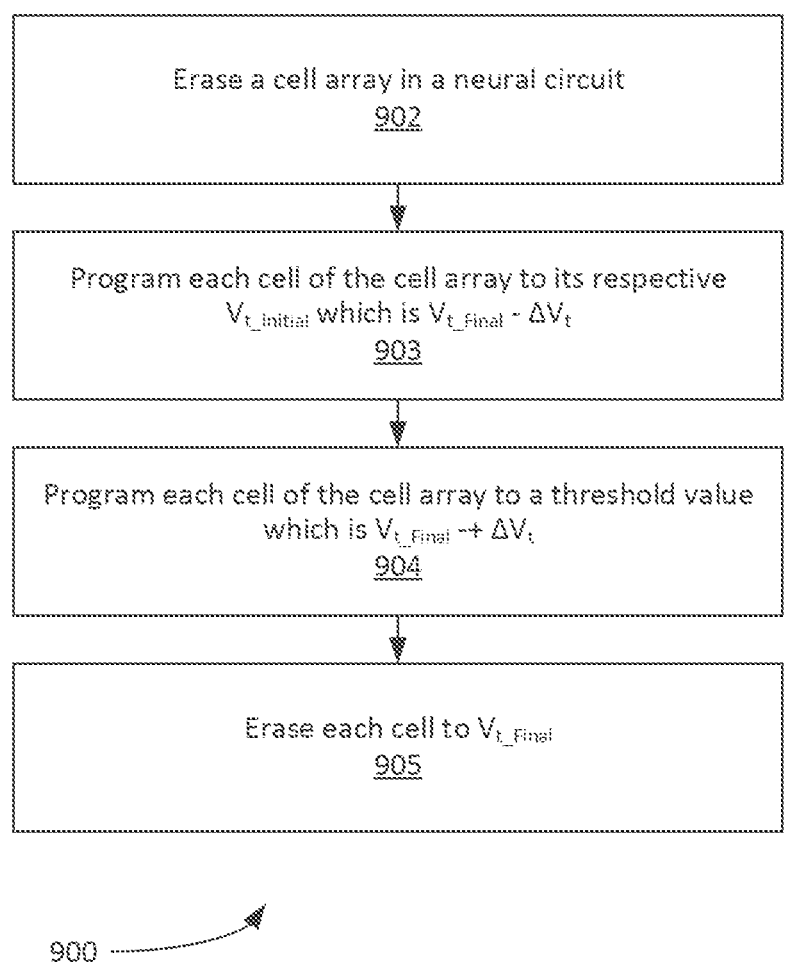
FIG. 9 illustrates an example process for implementing a soft-landing programming algorithm in a neural array-based flash memory, according to some embodiments.

FIG. 9 illustrates an example process 900 for cell-array programming in a neural circuit, according to some embodiments. In step 902, process 900 erases a cell array in a neural circuit. In step 903, process 900 programs the cell to an initial target threshold value ($V_{t\_final}-\Delta V_t$) which is marginally lower than the final target threshold voltage. In step 904, process 900 programs each cell of the cell array to a second initial target threshold voltage ($V_t$) value, where the second initial target threshold voltage is greater than the final target threshold voltage by a small $\Delta V_t$ i.e. ($V_{t\_final}+\Delta V_t$). In step 905, cell is weak erased to the final target threshold voltage ($V_{t\_final}$).

CONCLUSION

Methods of accurate and high resolution programming of threshold voltages in flash cells are shown.

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

What is claimed as new and desired to be protected by Letters Patent of the United States is:

1. A method for NOR flash cell-array programming in a neural circuit comprising:

erasing a cell array;

programming a set of reference cells of a reference cell array to a target reference threshold voltage (Vt_ref);

generating, with the reference cells, a current or voltage, reference signal;

using the reference signal to bias a neural cells during verification of program state of the neural cells to achieve their respective target threshold voltages (Vt_cell); and programming a set of neural cells of a neural cell array to their respective target threshold voltages, wherein a neural cell comprises a flash-cell system, wherein an equation for a neural cell comprises $Eq^{neuron} = \Sigma(x_i * y_i) + b$, where, $x_i$ is the set of input vectors, $y_i$ is parameter which is related to a threshold voltage of individual flash cells, and b is a bias variable, wherein the cells are first programmed to a pre-final threshold values (Vt_initial_1) as defined in $y_i$ in a first sequence on program and program verify pulses as defined in $x_i$, wherein the cells are then programmed to a second pre-final threshold values (Vt_initial_2) as defined in $y_i$ in a second subsequent sequence of program and program verify pulses as defined in $x_i$, and where the second pre-final threshold values are larger than the final target threshold values, and wherein the cells are then weak erased to the final target threshold values as defined in $y_i$ with a sequence of erase pulses and erase verify pulses, wherein the final threshold value is considered reached if the threshold value is close to (less than or equal to) the final target threshold value, wherein the weak erase comprises an erase voltage level only detraps a plurality of shallow traps in an oxide layer or a nitride layer of the flash cell without effectively changing the threshold voltage.

* * * * *